(12) United States Patent
Kim et al.

(10) Patent No.: US 7,381,574 B2
(45) Date of Patent: Jun. 3, 2008

(54) METHOD OF FORMING DUAL INTERCONNECTS IN MANUFACTURING MRAM CELLS

(75) Inventors: Woosik Kim, Boissettes (FR); Chanro Park, Seine (FR)

(73) Assignees: Infineon Technologies AG, Neubiberg (DE); Altis Semiconductor, Corbeil Essonnes Cedex (FR)

(*) Notice: Subject to any disclaimer, the term of this patent is extended or adjusted under 35 U.S.C. 154(b) by 226 days.

(21) Appl. No.: 11/289,787

(22) Filed: Nov. 30, 2005

(65) Prior Publication Data

US 2007/0123023 A1    May 31, 2007

(51) Int. Cl.
*H01L 21/00* (2006.01)

(52) U.S. Cl. .......................... 438/3; 438/618

(58) Field of Classification Search .............. 438/3, 438/618

See application file for complete search history.

(56) References Cited

U.S. PATENT DOCUMENTS 6,806,096 B1 * 10/2004 Kim et al. .................. 438/3

* cited by examiner

*Primary Examiner*—Mark V. Prenty
(74) *Attorney, Agent, or Firm*—Edell, Shapiro & Finnan, LLC

(57) ABSTRACT

A method of forming dual interconnects in a magnetoresistive memory cell includes: providing an intermediate product including: a metallization layer including metallic lines; a magnetoresistive junction element conductively connected to a first of the metallic lines by a via through a first non-conductive layer; a metallic hard mask disposed on the magnetoresistive junction element; a second non-conductive layer above the first non-conductive layer in regions over the hard mask and a second of the metallic lines; a third non-conductive layer disposed above the hard mask; and a fourth non-conductive layer disposed on the third non-conductive layer. The method further includes partially opening first and second trenches to uncover the second non-conductive layer above the hard mask and second metallic line, respectively; fully opening the first and second trenches to uncover the hard mask and second metallic line, respectively; and filling the first and second trenches with conductive material.

8 Claims, 5 Drawing Sheets

METHOD OF FORMING DUAL INTERCONNECTS IN MANUFACTURING MRAM CELLS

FIELD OF THE INVENTION

The present invention relates to the fabrication of non-volatile semiconductor memory chips and more particularly is concerned with a method of forming dual interconnects in manufacturing magnetoresistive random access memory cells (MRAM cells) for use in a semiconductor integrated circuit.

BACKGROUND

An MRAM cell basically includes a stacked structure of magnetic layers that are separated by a non-magnetic tunneling barrier layer to form a magnetoresistive tunnel junction (MTJ) element, or are separated by a conductive layer to form a magnetoresistive conductive junction (MCJ) element, both of which are commonly referred to as magnetoresistive junction elements. In MRAM cells, magnetization of one magnetic layer is fixed, while magnetization of another magnetic layer is free to be switched between two preferred directions along an easy axis thereof. One bit of logic information can thus be stored by selecting the orientation of the freely switchable magnetization with respect to the fixed magnetization.

Standard CMOS processing for manufacturing of MRAMs starts with preparing a silicon or other suitable semiconductor substrate that is provided with active structures such as transistors and the like. Above the semiconductor substrate, metal lines and via contacts are formed to provide interconnections for the integrated circuit and the magnetoresistive memory cell array. These interconnections typically are formed by the well-known damascene technique which starts with depositing a dielectric layer on the semiconductor substrate, followed by masking and etching thereof, and depositing metallic material which is planarized to create embedded metallic structures that can be accessed from above.

In accordance with the standard CMOS process nomenclature, metallic lines forming the first layer of interconnects are referred to as the first metallization layer (M1). Via contacts formed in a layer of dielectric material deposited on M1 are referred to as the first via layer (V1). Metal lines formed in a layer of dielectric material deposited on V1 are referred to as the second metallization layer (M2), followed in sequence by a second via layer (V2) formed thereupon, and so on, to provide as many via layers and metallization layers as are needed for the specific apparatus and application.

Reference is now made to FIGS. 1A through 1D depicting vertical sectional views of intermediate products in a standard CMOS process of manufacturing MRAM cells. Accordingly, starting with the arrangement shown in FIG. 1A, a layer of dielectric material that is not further detailed in the figures is formed on a semiconductor substrate (not shown) and is provided with metallic lines 1, e.g., made of copper (Cu), to thereby create a metallization layer, which can be identified as M2. Thereupon, a dielectric bilayer 2 which, for example, can be made of silicon nitride (SiN) or silicon carbide (SiC) is formed, through which via 3 is formed to create a via layer, which can be identified as V1. Via 3 conductively connects metal line 1' with conductive plate 4 formed on V1. Conductive plate 4 is in electric contact with a magnetoresistive junction element 5 formed on conductive plate 4. On the magnetoresistive junction element 5 in electric contact therewith, a hard mask 6 made of metallic material is formed to have a thickness B of, for example, more than 140 nanometers (nm), followed by embedding magnetoresistive junction element 5 and hard mask 6 in a dielectric layer 7 made of, for example, silicon oxide, onto which, typically, a SiN-layer 8 is formed to thereby enhance deposition of a thick interlayer dielectric (ILD) 9, for example made of silicon oxide. Thick ILD 9 then is planarized, for example, using chemical-mechanical polishing (CMP), to reduce ILD 9, for example, to a layer thickness A of about 660 nm (see FIG. 1B).

After thinning ILD 9, first trench 10 above magnetoresistive junction element 5 uncovering the hard mask 6 and second trench 11 above the conductive line 1" are formed using conventional etch-lithography techniques. After deepening the second opening 11 to uncover the conductive line 1", conductive material 12, 13 for electrically contacting the magnetoresistive junction element 5 via metallic hard mask 5 from above and for electrically contacting conductive line 1" from above, respectively, is deposited (see FIGS. 1C and 1D). Accordingly, depositing conductive materials 12, 13 results in creating dual via contacts for electrically connecting magnetoresistive junction element 5 and conductive line 1" to metallic lines formed thereupon.

Etching of the first and second trenches 10, 11 is typically a two-step process, i.e., a first etch step of simultaneously etching first trench 10 down to hard mask 6 and second trench 11 down to the height of protrusion 20, followed by a second etch step to etch second trench 11 down to conductive line 1".

In conventional manufacturing of MRAM cells as explained with reference to FIGS. 1A-1D, a direct interconnection between thick hard mask 6 and an upper conductive line is established to avoid inter-level shorts.

Inter-level shorts and opens typically behave like a pair of scales in M3 etch. If the M3 etch level is deeper, the yield of shorts decreases while the yield of opens increases. Conversely, if the etch level is shallower, the inter-level short yield improves in inverse proportion to the open yield's decrease. As inter-level short and open yield has been very sensitive to this trench etch amount, the M3 etch needs a very powerful endpoint system and process window. However, the M3 etch process window depends mainly on the MTJ hardmask thickness in conventional integration, which is the physical length from the upper conductive line to the MB plate.

Basically, this kind of poor processing window results from poor integration, which does not have any stopping layer though the trench pattern is designed with several different pattern densities, called the pattern loading effect.

Other effects that diminish the process margin include dielectric deposition and CMP non-uniformity as well as etch non-uniformity. However, these non-uniformities have an effect on the worse process window in the conventional structure, because non-uniformity and the pattern loading effect can be absorbed by a stop layer with a highly selective etch process.

SUMMARY

The invention provides an improved method of forming dual interconnects in MRAM technology, thereby avoiding the conventional inter-level short problem and permitting a broader process margin. Accordingly, a method of forming dual interconnects in manufacturing a magnetoresistive memory cell includes providing an intermediate product that comprises: a semiconductor substrate having active structures such as transistors and the like on a surface thereof; at least one metallization layer comprising a plurality of metallic lines formed above the active structures of the semiconductor substrate; a first non-conductive layer made of non-conductive material such as silicon nitride (SiN) formed above the metallization layer, which is provided with a via contact for conductively contacting a first one of the metallic lines; a magnetoresistive junction element formed above the first non-conductive layer and conductively connected to the via contact; a metallic hard mask formed on the magnetoresistive junction element and conductively connected therewith, the hard mask preferably having a thickness of less than 30 nm (as seen perpendicularly to the semiconductor substrate's surface provided with active structures); a second non-conductive layer made of non-conductive material such as silicon oxide formed above the first non-conductive layer at least in a region over the hard mask and at least in a region over a second one of the metallic lines of the metallization layer to be connected with an upper metal line; a third non-conductive layer made of non-conductive material such as SiN or silicon carbide (SiC) having etch-selectivity as to the second non-conductive layer and formed in at least a region above the hard mask; and a fourth non-conductive layer made of non-conductive material such as silicon oxide formed at least on the third non-conductive layer.

The method further includes partially opening a first opening to uncover the second non-conductive layer at least above a portion of the hard mask and partially opening a second opening to uncover the second non-conductive layer at least above a portion of the second metallic line, where first and second openings are opened in the same opening operation. Opening typically is effected using conventional lithography and etch steps.

Alternatively, if the third non-conductive layer is chosen to have etch-selectivity as to the fourth non-conductive layer, the first and second openings may also be partially opened to uncover the third non-conductive layer at least above a portion of the hard mask, and the third non-conductive layer at least above a portion of the second metallic line, where partially opening of the first and second opening can be effected in the same opening operation. Opening typically is effected using conventional lithography and etch steps.

The method further includes fully opening the first opening to uncover the hard mask and fully opening the second opening to uncover the second metallic line, where fully opening of first and second opening can be effected in the same opening operation. Opening typically is effected using conventional lithography and etch steps. The first and second openings are then filled with conductive material (which can be performed in the same operation).

Furthermore, a cleaning operation can be performed using the third non-conductive layer as a protecting layer, so that shorts due to cleaning-caused voids which then may be filled with conductive material can advantageously be avoided.

Other and further objects, features and advantages of the invention will appear more fully from the following description.

BRIEF DESCRIPTION OF THE DRAWINGS

The accompanying drawings, which are incorporated in and constitute a part of the specification, illustrate an embodiment of the invention, and together with the general description given above and the detained description given below, serve to explain the principles of the invention.

DETAILED DESCRIPTION

Figure 1A:
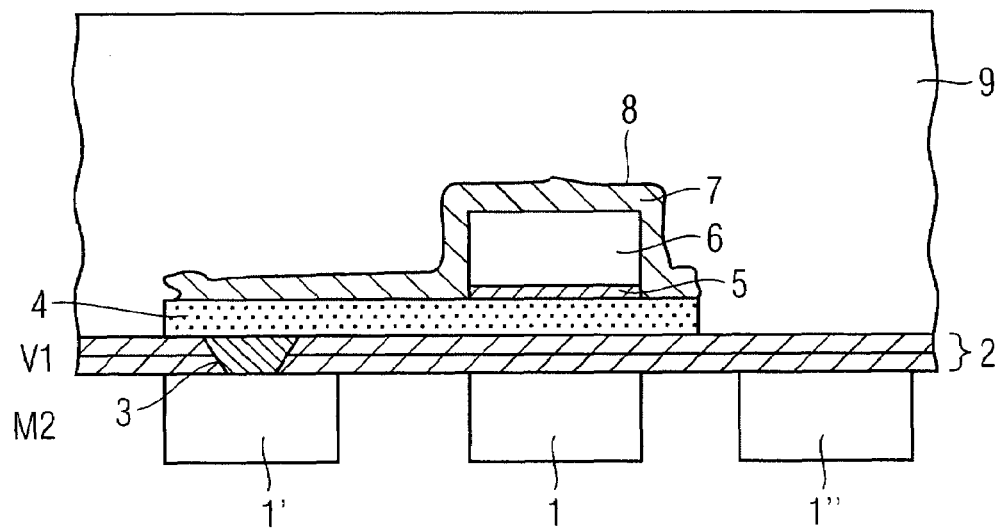
FIGS. 1A to 1D depict schematically vertical sectional views of intermediate products in forming interconnects in manufacturing an MRAM-cell.
Figure 1B:
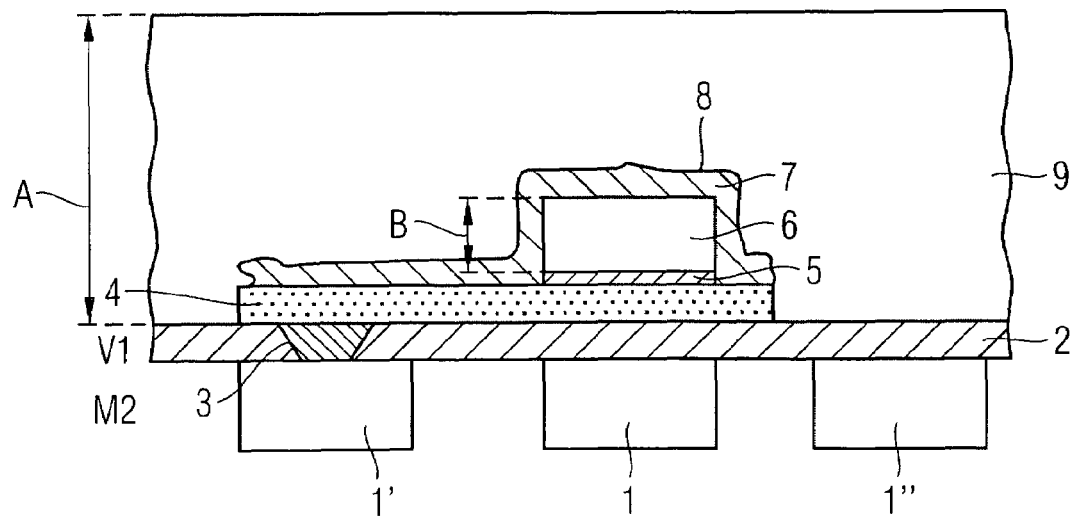
Figure 1C:
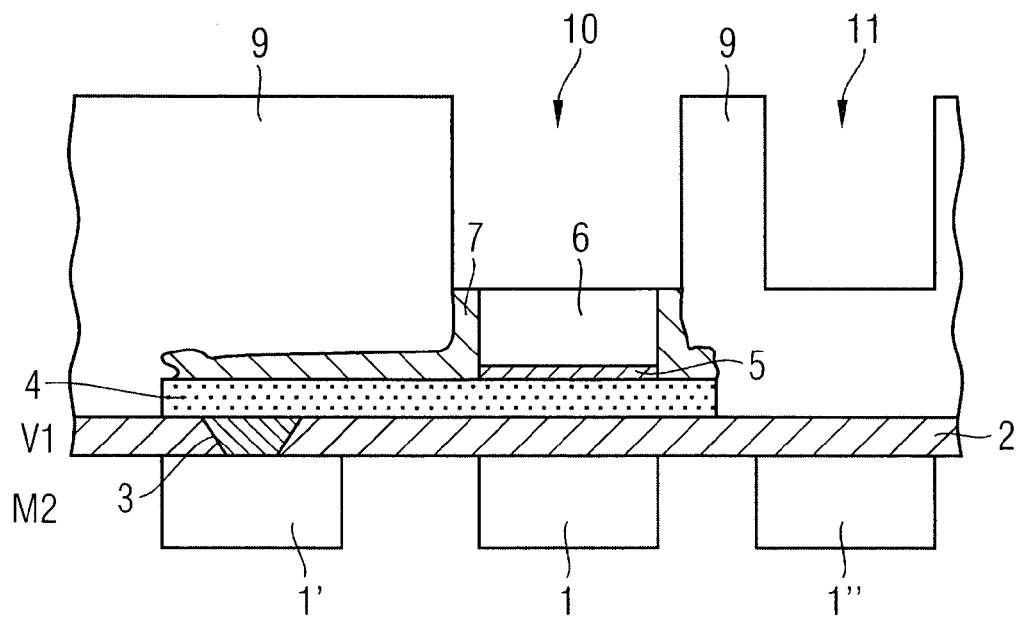
Figure 1D:
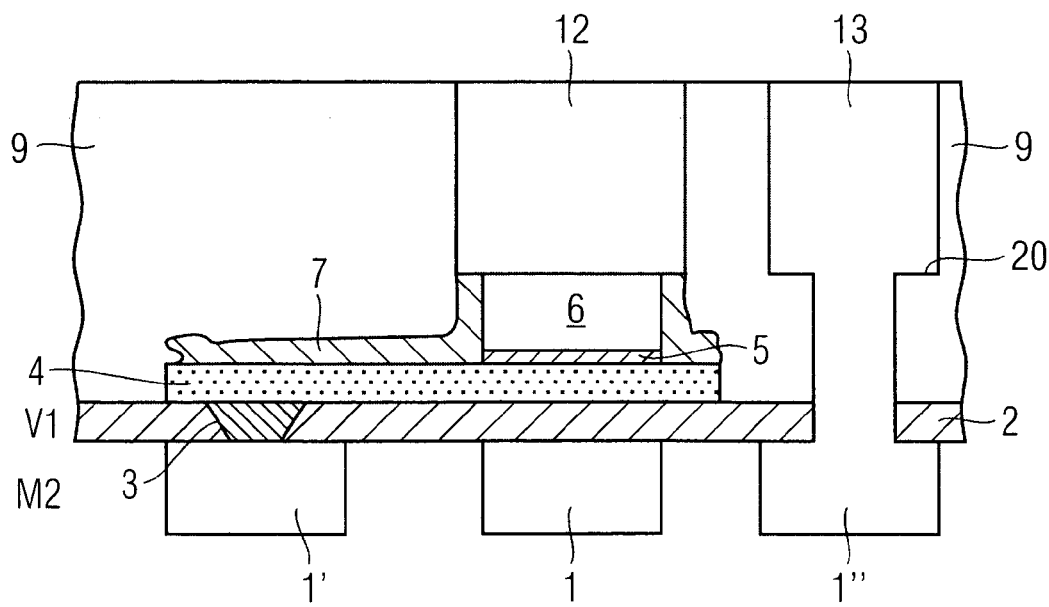
Figure 2A:
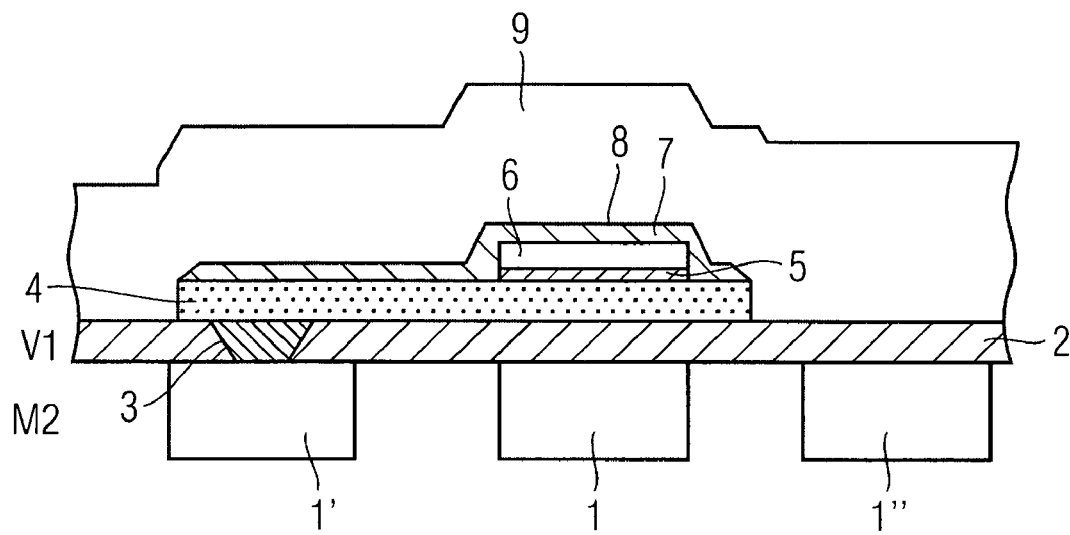
FIGS. 2A to 2F depict schematically vertical sectional views of intermediate products in forming dual interconnects in manufacturing an MRAM cell according to an exemplary embodiment of the invention.
Figure 2B:
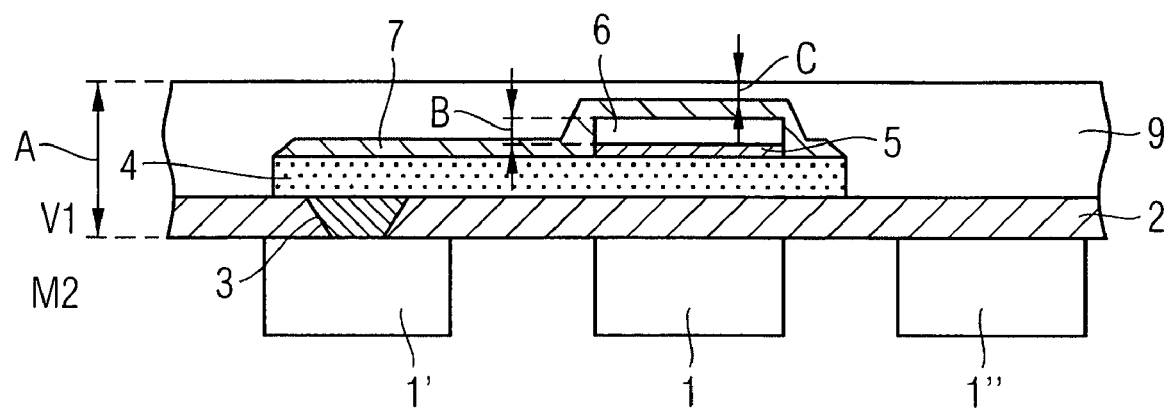
Figure 2C:
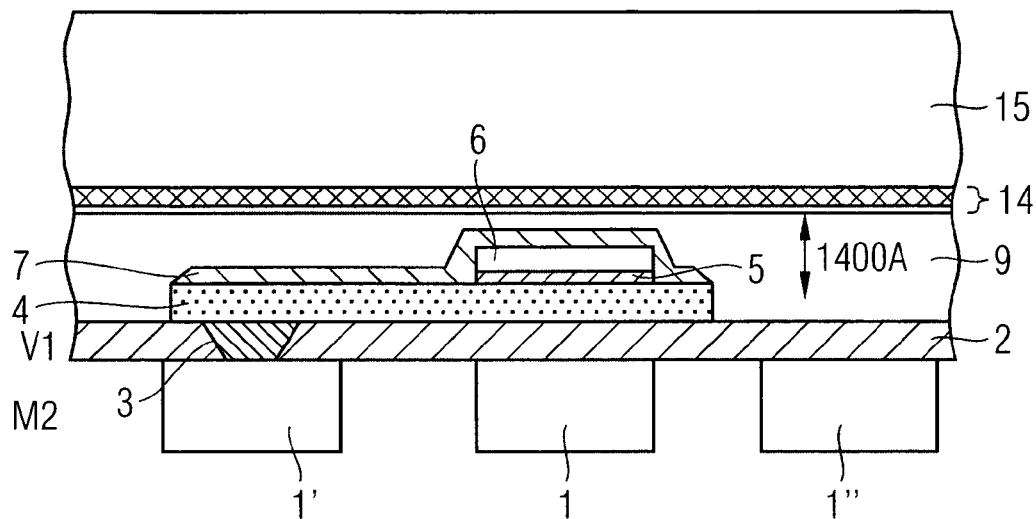
Figure 2D:
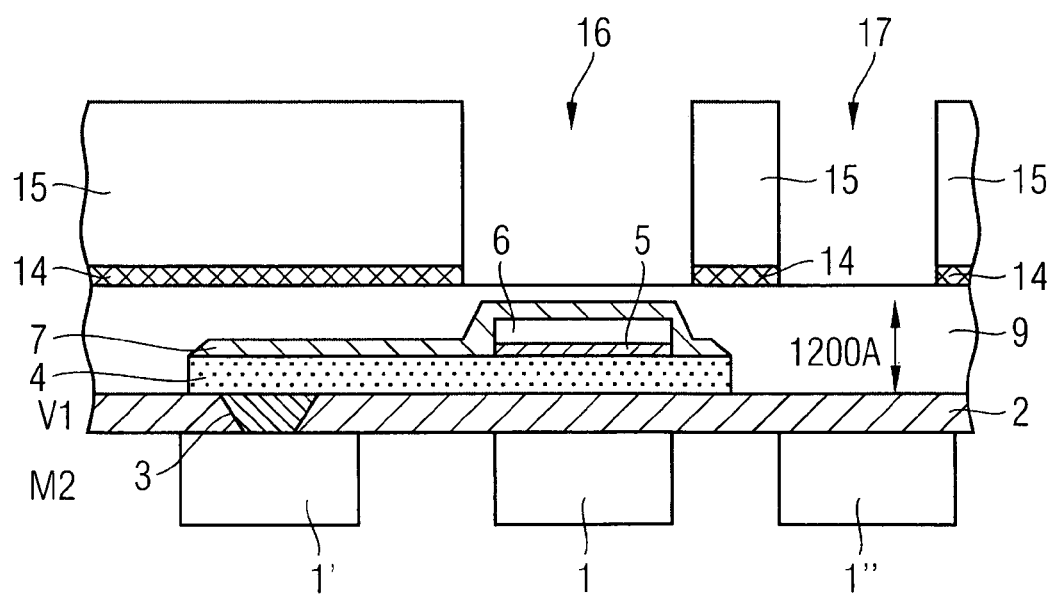

An exemplary embodiment of the present invention will be described in detail below with reference to the accompanying drawings, where like designations denote like or similar elements. FIGS. 2A-2F depict schematically vertical sectional views of intermediate products to illustrate a method of forming dual interconnects in manufacturing MRAM cells according to an exemplary embodiment of the invention. Referring to FIG. 2A, a layer of dielectric material is formed on a semiconductor substrate (not shown), which layer is provided with metallic lines 1 made of copper (Cu), for example, to thereby create a metallization layer, which can be identified as M2. Thereupon, a dielectric layer 2 which, for example, can be made of silicon nitride (SiN) or silicon carbide (SiC) is formed, through which a via 3 is formed to create a via layer, which can be identified as V1. Via 3 conductively connects metal line 1' with conductive plate 4 formed on V1. Conductive plate 4 is in electric contact with a magnetoresistive junction element 5 formed on conductive plate 4. On the magnetoresistive junction element 5 in electric contact therewith, a hard mask 6 made of metallic material is formed to have a thickness B of, for example, less than 30 nm, which is much thinner than in the conventional case described above. Magnetoresistive junction element 5 and hard mask 6 are embedded in dielectric layer 7 made of silicon oxide, for example, onto which, typically, a SiN-layer 8 is formed to thereby enhance deposition of a thick interlayer dielectric (ILD) 9 made of silicon oxide, for example. Thick ILD 9 then is planarized, for example, using chemical-mechanical polishing (CMP), to reduce it to a layer thickness A of about 160 nm (see FIG. 2B), which is much thinner than in the conventional cased described above. The remaining silicon oxide layer 9 above hard mask amounts to a thickness C of about 80 nm.

After thinning ILD 9, an etch-stop layer 14 is deposited on silicon oxide layer 9. The etch-stop layer 14 typically is made of SiN or SiC and has etch-selectivity as to silicon oxide, followed by deposition of another silicon oxide layer 15 on the etch-stop layer 14 (see FIG. 2C).

Figure 2E:
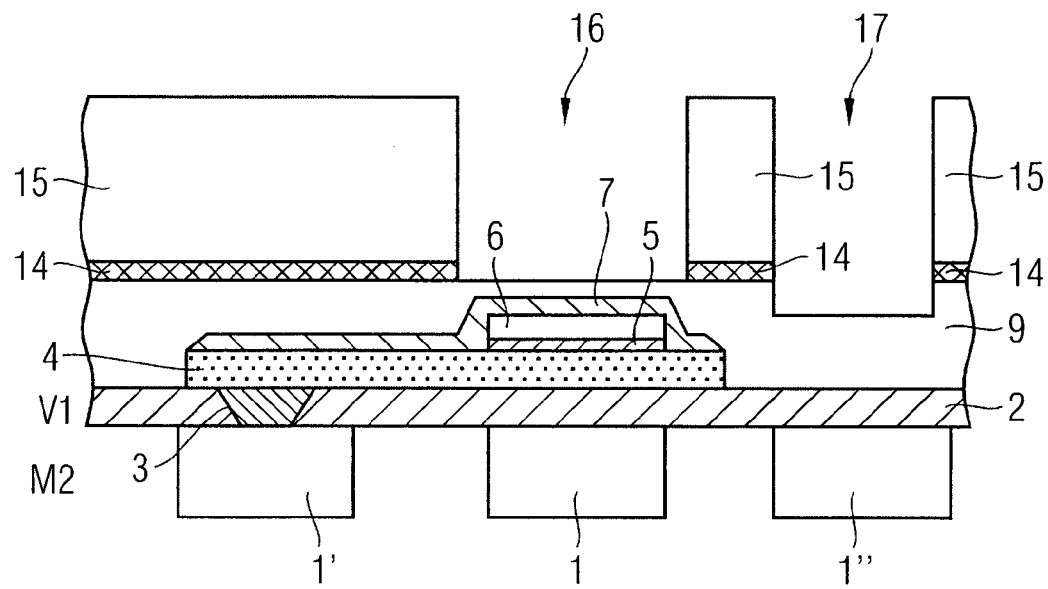

Next, a first trench 16 above magnetoresistive junction element 5 down to etch-stop layer 14 is partially etched using conventional etch-lithography techniques leaving silicon oxide layer 9 above hard mask 6. Simultaneously, second trench 17 above second metallic line 1" is partially etched (see FIG. 2D). FIG. 2E shows a situation where partially etching has created a deeper second trench 17. However, the etching amount is controlled by the etch-stop layer and selective etch process with conventional etch gas chemistry. Consequently, non-uniformity and pattern loading effects are minimized by this first selective trench process. This second etch is designed to remove the etch stop layer with optimized minimum recess to increase the inter-level short and open process window.

Figure 2F:
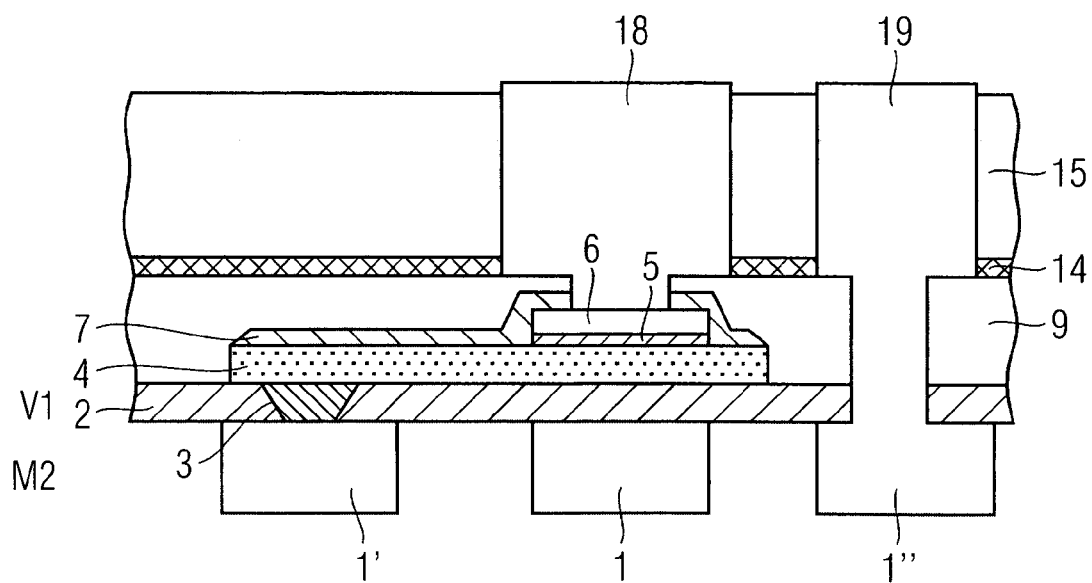

After deepening the first and second trenches to uncover hard mask 6 and conductive line 1", conductive material 18, 19 for electrically contacting the magnetoresistive junction element 5 via metallic hard mask 6 from above and for electrically contacting conductive line 1" from above, respectively, is deposited (see FIG. 2F). Accordingly, depositing conductive material 18, 19 results in creating dual via contacts for electrically connecting magnetoresistive junction element 5 and conductive line 1'' to metallic lines formed thereupon.

This dual contact converts the concept of process window control from the etch amount to CD and misalignment without any disadvantage in the magnetic properties. Some impact was shown in conventional contact processing due to electric field change. Because MTJ needs a strong electric field for achieving better magnetic properties that is determined by physical length between MTJ and upper or lower metal line in the same condition. Consequently, it is available to make a conventional contact etch with a deep depth, which will weaken the electric field. However, this invention provides the same physical length and the same electric field, because a stop layer is used to reduce the non-uniformity and loading effect.

Regarding process window control, the CD and misalignment control of the contact is much better method because it is based on a specific value, which can be easily controlled by the CD specification or misalignment specification.

There are many metallic sidewall polymers with MTJ patterns, because most of them are non-volatile. However, the contact type inter-connection reduces the chance of an inter-level short, because it minimizes the chance of hitting them by CD adjustment and misalignment control.

Many modifications and variations of the present invention are possible in light of the above description. It is therefore to be understood, that within the scope of appended claims, the invention may be practiced otherwise than as specifically devised.

REFERENCE LIST

1 Metallic line
2 SiN-layer
3 Via contact
4 Conductive plate
5 Magnetoresistive junction element
6 Hard mask
7 Silicon oxide layer
8 SiN-layer
9 Silicon oxide layer
10 First trench
11 Second trench
12 Conductive material
13 Conductive material
14 Etch-stop layer
15 Silicon oxide layer
16 First trench
17 Second trench
18 Conductive material
19 Conductive material
20 Protrusion

What is claimed is:

1. A method of forming dual interconnects in manufacturing a magnetoresistive memory cell, the method comprising:

providing an intermediate product comprising: a semiconductor substrate including active structures on a surface thereof at least one metallization layer comprising a plurality of metallic lines disposed above the active structures of the semiconductor substrate; a first non-conductive layer comprising a non-conductive material disposed above the metallization layer and including a via contact for conductively contacting a first one of the metallic lines; a magnetoresistive junction element disposed above the first non-conductive layer and conductively connected to the via contact; a metallic hard mask disposed on the magnetoresistive junction element and conductively connected therewith; a second non-conductive layer comprising a non-conductive material disposed above the first non-conductive layer at least in a region over the hard mask and at least in a region over a second one of the metallic lines of the metallization layer; a third non-conductive layer comprising a non-conductive material having etch-selectivity as to the second non-conductive layer disposed at least in a region above the hard mask; and a fourth non-conductive layer disposed at least on the third non-conductive layer;

partially opening a first trench to uncover the second non-conductive layer at least above a portion of the hard mask and partially opening a second trench to uncover the second non-conductive layer at least above a portion of the second metallic line in a same opening operation;

fully opening the first trench to uncover the hard mask;

fully opening the second trench to uncover the second metallic line, wherein fully opening the first trench and fully opening the second trench are performed in a same opening operation;

filling the first trench with conductive material; and filling the second trench with conductive material.

2. The method of claim 1, wherein filling of the first trench with conductive material and filling of the second trench with conductive material are performed in a same filling operation.

3. The method of claim 1, further comprising performing a cleaning operation using the third non-conductive layer as a protecting layer.

4. The method of claim 1, wherein the third non-conductive layer has etch-selectivity with respect to the fourth non-conductive layer.

5. The method of claim 4, further comprising partially opening the first trench to uncover the third non-conductive layer at least above a portion of the hard mask and partially opening the second trench to uncover the third non-conductive layer at least above a portion of the second metallic line in a same opening operation.

6. The method of claim 1, wherein the hard mask has a thickness of less than 30 nm.

7. A method of forming dual interconnects in manufacturing a magnetoresistive memory cell, the method comprising:

providing an intermediate product comprising: a semiconductor substrate including active structures on a surface thereof; at least one metallization layer comprising a plurality of metallic lines disposed above the active structures of the semiconductor substrate; a first non-conductive layer comprising a non-conductive material disposed above the metallization layer and including a via contact for conductively contacting a first one of the metallic lines; a magnetoresistive junction element disposed above the first non-conductive layer and conductively connected to the via contact; a metallic hard mask disposed on the magnetoresistive junction element and conductively connected therewith; a second non-conductive layer comprising a non-conductive material disposed above the first non-conductive layer at least in a region over the hard mask and at least in a region over a second one of the metallic lines of the metallization layer; a third non-conductive layer comprising a non-conductive material having etch-selectivity as to the second non-conductive layer disposed at least in a region above the hard mask; and a fourth non-conductive layer disposed at least on the third non-conductive layer;

partially opening a first trench to uncover the second non-conductive layer at least above a portion of the hard mask and partially opening a second trench to uncover the second non-conductive layer at least above a portion of the second metallic line in a same opening operation;

fully opening the first trench to uncover the hard mask;

fully opening the second trench to uncover the second metallic line;

filling the first trench with conductive material;

filling the second trench with conductive material; and performing a cleaning operation using the third non-conductive layer as a protection layer.

8. A method of forming dual interconnects in manufacturing a magnetoresistive memory cell, the method comprising:

providing an intermediate product comprising: a semiconductor substrate including active structures on a surface thereof; at least one metallization layer comprising a plurality of metallic lines disposed above the active structures of the semiconductor substrate; a first non-conductive layer comprising a non-conductive material disposed above the metallization layer and including a via contact for conductively contacting a first one of the metallic lines; a magnetoresistive junction element disposed above the first non-conductive layer and conductively connected to the via contact; a metallic hard mask disposed on the magnetoresistive junction element and conductively connected therewith, the hard mask comprising a thickness of less than 30 nm; a second non-conductive layer comprising a non-conductive material disposed above the first non-conductive layer at least in a region over the hard mask and at least in a region over a second one of the metallic lines of the metallization layer; a third non-conductive layer comprising a non-conductive material having etch-selectivity as to the second non-conductive layer disposed at least in a region above the hard mask; and a fourth non-conductive layer disposed at least on the third non-conductive layer;

partially opening a first trench to uncover the second non-conductive layer at least above a portion of the hard mask and partially opening a second trench to uncover the second non-conductive layer at least above a portion of the second metallic line in a same opening operation;

fully opening the first trench to uncover the hard mask;

fully opening the second trench to uncover the second metallic line;

filling the first trench with conductive material; and filling the second trench with conductive material.

* * * * *

UNITED STATES PATENT AND TRADEMARK OFFICE
CERTIFICATE OF CORRECTION

PATENT NO. : 7,381,574 B2 Page 1 of 1
APPLICATION NO. : 11/289787
DATED : June 3, 2008
INVENTOR(S) : Woosik Kim et al.

It is certified that error appears in the above-identified patent and that said Letters Patent is hereby corrected as shown below:

On the title page, item (75) Inventors:

"Chanro Park, Seine (FR)" should read -- Chanro Park Samois sur Seine (FR) --

Col. 3, line 66: "detained" should read -- detailed --

Signed and Sealed this

Twenty-sixth Day of August, 2008

JON W. DUDAS
*Director of the United States Patent and Trademark Office*